US010146145B2

(12) United States Patent
Egashira

(10) Patent No.: US 10,146,145 B2
(45) Date of Patent: Dec. 4, 2018

(54) MEASUREMENT APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Shinichi Egashira, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 319 days.

(21) Appl. No.: 14/973,888

(22) Filed: Dec. 18, 2015

(65) Prior Publication Data
US 2016/0202620 A1    Jul. 14, 2016

(30) Foreign Application Priority Data

Jan. 9, 2015    (JP) ................................. 2015-003608

(51) Int. Cl.
*G03F 9/00* (2006.01)
*G03F 7/20* (2006.01)
*G01B 11/27* (2006.01)

(52) U.S. Cl.
CPC .......... *G03F 9/7088* (2013.01); *G01B 11/272* (2013.01); *G03F 7/70775* (2013.01); *G03F 9/7011* (2013.01); *G03F 9/7046* (2013.01); *G03F 9/7092* (2013.01)

(58) Field of Classification Search
CPC .... G01B 11/272; G03F 9/7011; G03F 9/7088
See application file for complete search history.

(56) References Cited

U.S. PATENT DOCUMENTS

| 6,366,111 | B1 | 4/2002 | Kawai |
| 6,952,262 | B2 | 10/2005 | Yamamoto |
| 8,730,474 | B2 | 5/2014 | Scheruebl et al. |
| 2004/0058540 | A1 | 3/2004 | Matsumoto et al. |
| 2007/0002298 | A1 | 1/2007 | Visser |
| 2007/0076197 | A1 | 4/2007 | Koga |
| 2008/0063956 | A1 | 3/2008 | Egashira |
| 2008/0144047 | A1 | 6/2008 | Hayashi |

(Continued)

FOREIGN PATENT DOCUMENTS

| CN | 101021694 A | 8/2007 |
| JP | 2004111861 A | 4/2004 |

(Continued)

OTHER PUBLICATIONS

Office Action issued in Taiwanese Patent Application No. 104141149, dated Oct. 13, 2016. English translation provided.

(Continued)

*Primary Examiner* — Michelle M Iacoletti
(74) *Attorney, Agent, or Firm* — Rossi, Kimms & McDowell LLP

(57) ABSTRACT

The present invention provides a measurement apparatus that measures a position of an object, the apparatus including a detector configured to detect a mark formed on the object and generate a detection signal, and a processor configured to obtain the position of the object based on the detection signal, wherein the processor is configured to obtain the position of the object based on a portion of the detection signal that is limited based on information about a tolerance regarding a measurement precision for the object.

16 Claims, 13 Drawing Sheets

(56) References Cited

U.S. PATENT DOCUMENTS

| | | | |
|---|---|---|---|
| 2008/0309903 A1* | 12/2008 | Morimoto | G03F 9/7003 |
| | | | 355/53 |
| 2013/0229638 A1 | 9/2013 | Chen et al. | |
| 2015/0206298 A1 | 7/2015 | Miyazaki | |

FOREIGN PATENT DOCUMENTS

| | | | |
|---|---|---|---|
| JP | 2004235354 A | 8/2004 | |
| JP | 2006295154 A | 10/2006 | |
| JP | 2007013168 A | 1/2007 | |
| JP | 2007103658 A | 4/2007 | |
| JP | 2008066638 A | 3/2008 | |
| JP | 2008151689 A | 7/2008 | |
| JP | 5132277 B2 | 1/2013 | |
| JP | 2015138806 A | 7/2015 | |
| KR | 1020050120072 A | 12/2005 | |
| TW | 200949193 A1 | 12/2009 | |
| TW | 451204 A | 9/2014 | |

OTHER PUBLICATIONS

Office Action issued in Korean Application No. 10-2015-0189157 dated Aug. 31, 2018. English Translation provided.

* cited by examiner

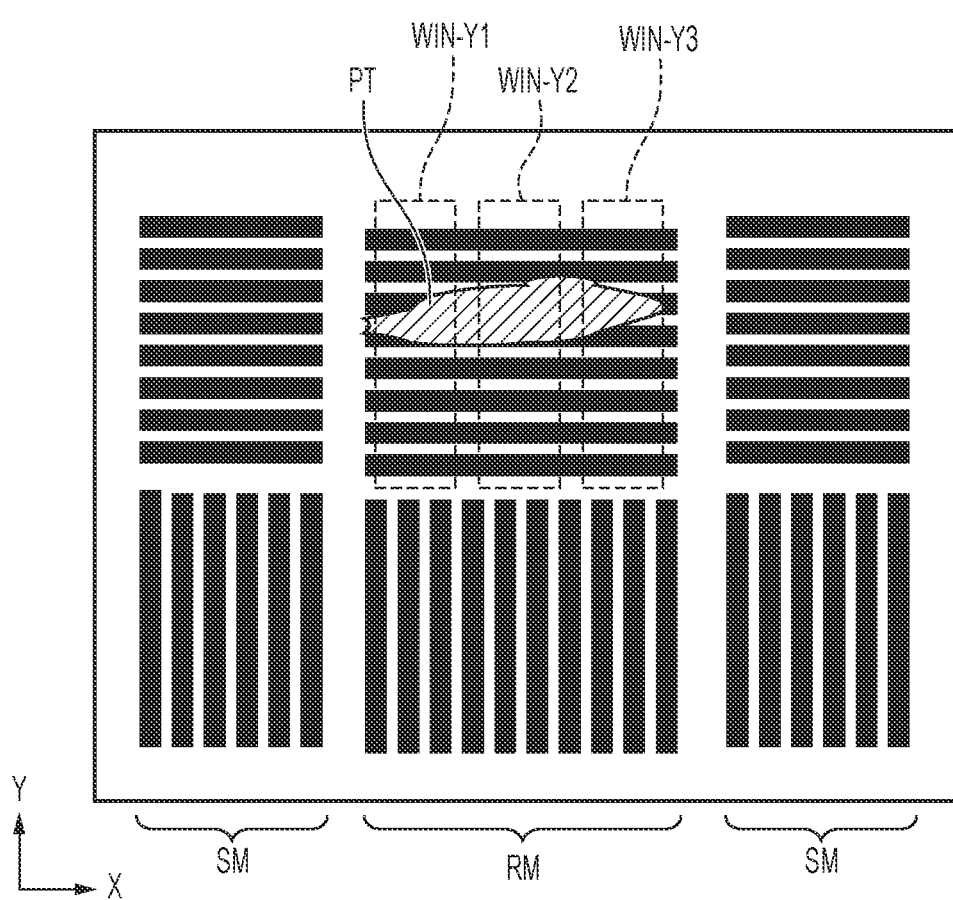

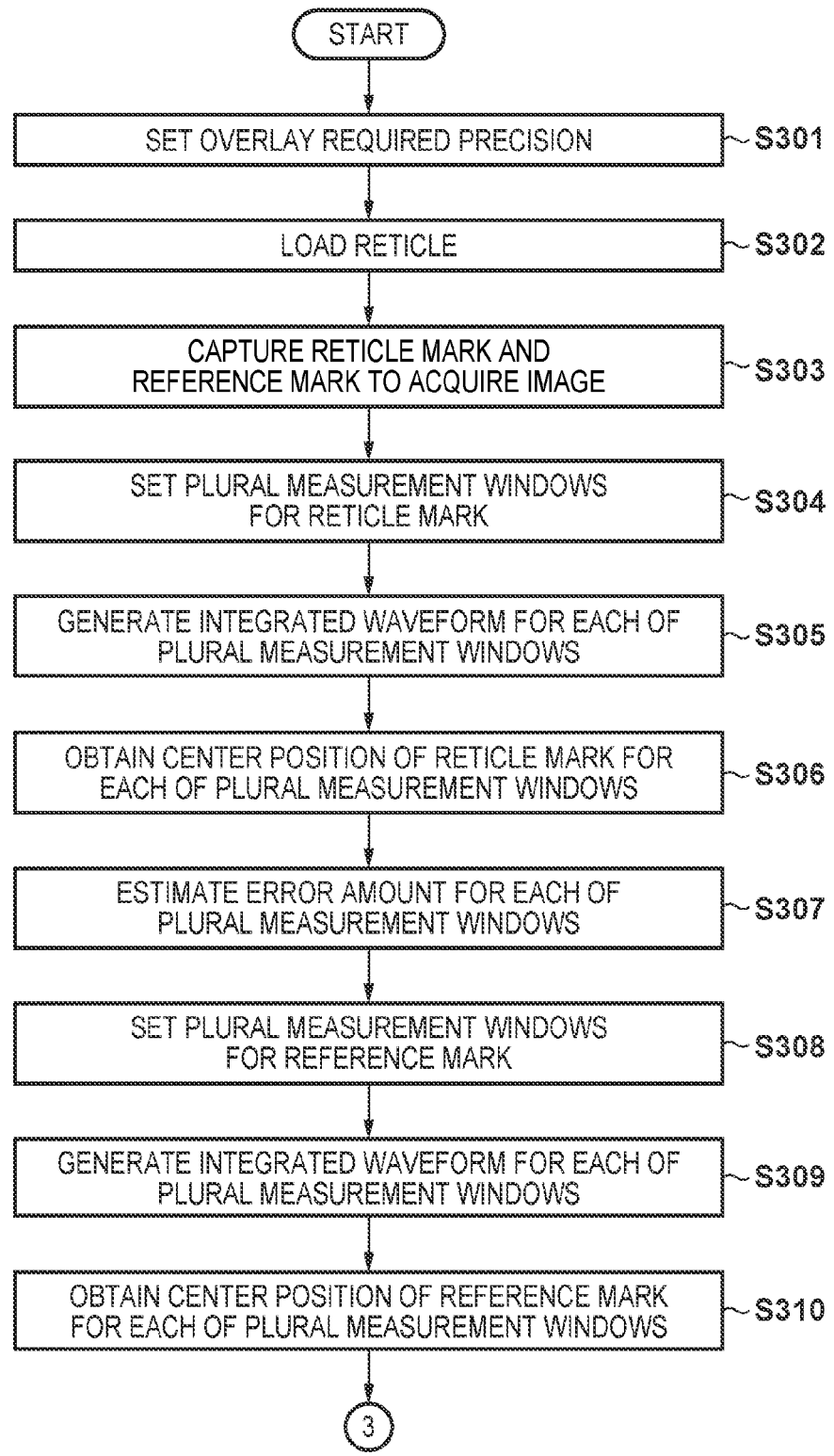

MEASUREMENT APPARATUS, LITHOGRAPHY APPARATUS, AND METHOD OF MANUFACTURING ARTICLE

BACKGROUND OF THE INVENTION

Field of the Invention

The present invention relates to a measurement apparatus, a lithography apparatus, and a method of manufacturing an article.

Description of the Related Art

As semiconductor devices become finer and are integrated at a higher density, higher performance is requested of a lithography apparatus (for example, an exposure apparatus) used to manufacture such semiconductor devices. For example, the precision of alignment between a reticle (mask) and a substrate is important as the performance of the exposure apparatus, and there is a demand for a technique of aligning the image of the pattern of a reticle with a pattern formed on a substrate in the nanometer order.

The exposure apparatus sequentially transfers the pattern of a reticle to shot regions of a substrate with the intervention of step movement of the substrate. Exposure apparatuses of this type are classified into a so-called stepper that performs the transfer at once, and a so-called scanner that performs the transfer while scanning a substrate.

As disclosed in Japanese Patent Laid-Open No. 2004-235354, alignment of a reticle (also called reticle alignment) with respect to a reticle stage can be performed by detecting a reticle mark provided on the lower surface of the reticle and a reference mark provided on the upper surface of the reticle stage. Accordingly, for example, the misalignment amount of the reticle with respect to the reticle stage can be measured. When transferring the pattern of the reticle to the substrate, at least one of the position of the reticle stage and the position of the substrate stage can be corrected to perform alignment between the pattern image of the reticle and the substrate with a high precision.

When a particle (dust) is attached to the reticle mark or the reference mark, or a defect such as a scratch exists, the position of the mark may be erroneously measured. In such a case, reticle alignment processing is stopped as an error. However, if the processing is stopped even in a case in which a measurement error arising from a particle or a scratch is negligible in terms of precision when processing substrates with various overlay required precisions, the throughput of the exposure apparatus (measurement apparatus) is decreased.

SUMMARY OF THE INVENTION

The present invention provides, for example, a measurement apparatus advantageous in throughput thereof.

According to one aspect of the present invention, there is provided a measurement apparatus that measures a position of an object, the apparatus including a detector configured to detect a mark formed on the object and generate a detection signal, and a processor configured to obtain the position of the object based on the detection signal, wherein the processor is configured to obtain the position of the object based on a portion of the detection signal that is limited based on information about a tolerance regarding a measurement precision for the object.

Further features of the present invention will become apparent from the following description of exemplary embodiments (with reference to the attached drawings).

BRIEF DESCRIPTION OF THE DRAWINGS

FIG. 8 is a view showing an example of a plurality of measurement windows set for the reticle mark.

FIGS. 9A and 9B are flowcharts for explaining measurement processing according to the third embodiment.

DESCRIPTION OF THE EMBODIMENTS

Figure 1:
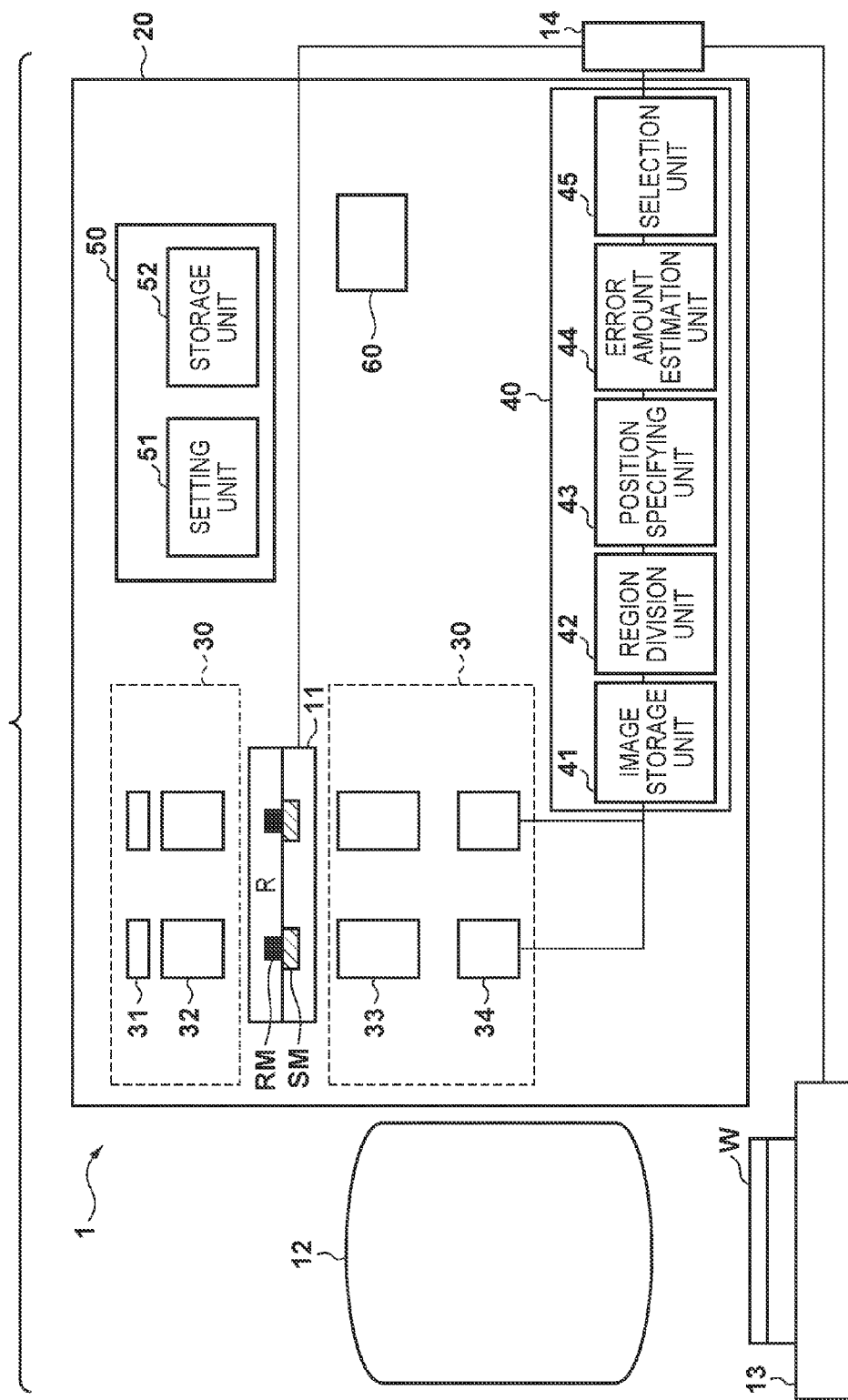
FIG. 1 is a schematic view showing the arrangement of an exposure apparatus as one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 1 as one aspect of the present invention. The exposure apparatus 1 is a lithography apparatus that performs patterning on a substrate by a beam. The exposure apparatus 1 exposes the substrate through a reticle (mask). The exposure apparatus 1 includes an illumination optical system (not shown) that illuminates a reticle R, a reticle stage (holder) 11 that can move while holding the reticle R, a measurement apparatus 20, and a projection optical system 12 that projects the pattern of the reticle R to a substrate W. The exposure apparatus 1 also includes a substrate stage (holder) 13 that can move while holding the substrate W, and a controller 14 that includes a CPU, memory, and the like and controls the overall (operation of) exposure apparatus 1.

The reticle R is an original for patterning and is loaded onto the reticle stage 11 by a reticle transfer system (not shown). A reticle mark RM is provided on the lower surface of the reticle R. A reference mark SM is provided on the upper surface of the reticle stage 11.

Figure 2:
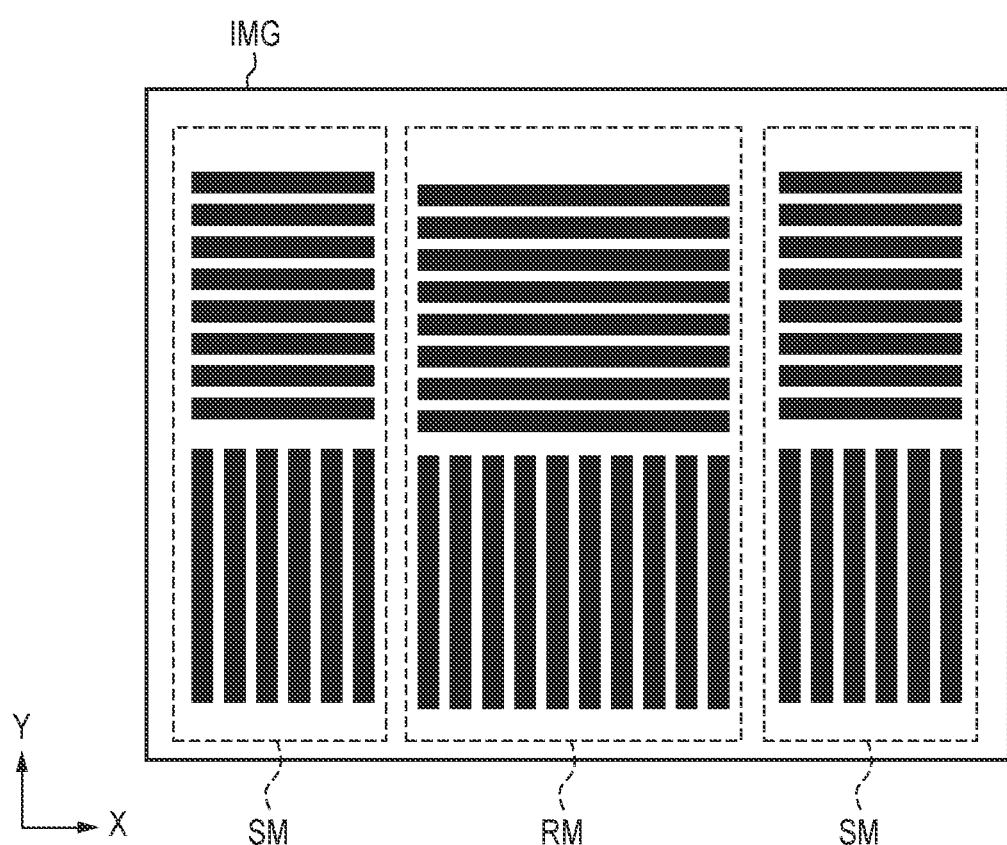
FIG. 2 is a view showing an example of the respective layouts of a reticle mark and reference mark.

As shown in FIG. 2, each of the reticle mark RM and reference mark SM includes an X mark for measuring a position in the X-axis direction and a Y mark for measuring a position in the Y-axis direction. In the reticle mark RM and the reference mark SM, each of the X mark and Y mark is constituted by a plurality of bar marks (mark elements).

Figure 3A:
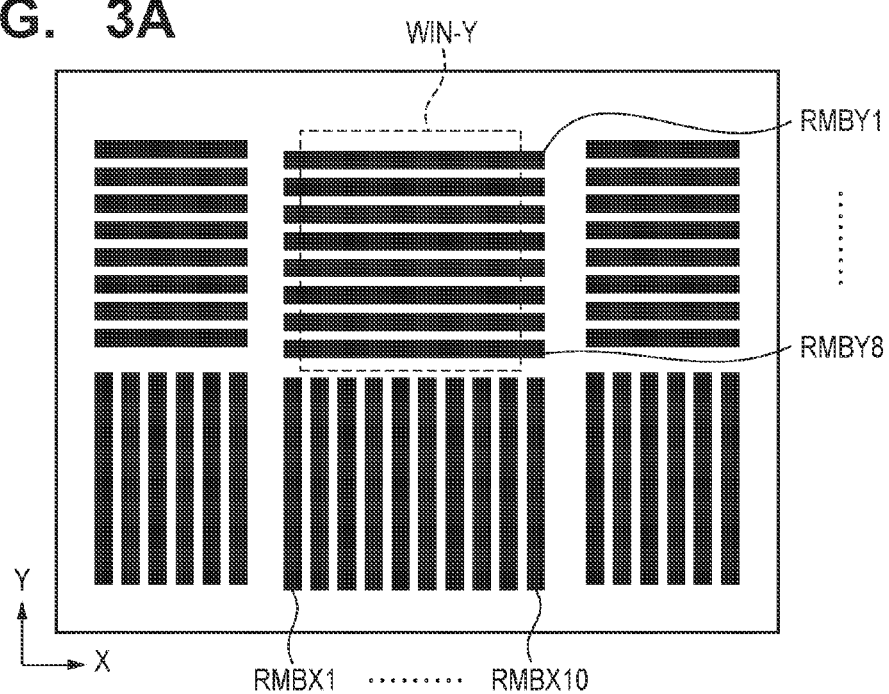
FIGS. 3A and 3B are views showing an example of the respective layouts of the reticle mark and reference mark.
Figure 3B:
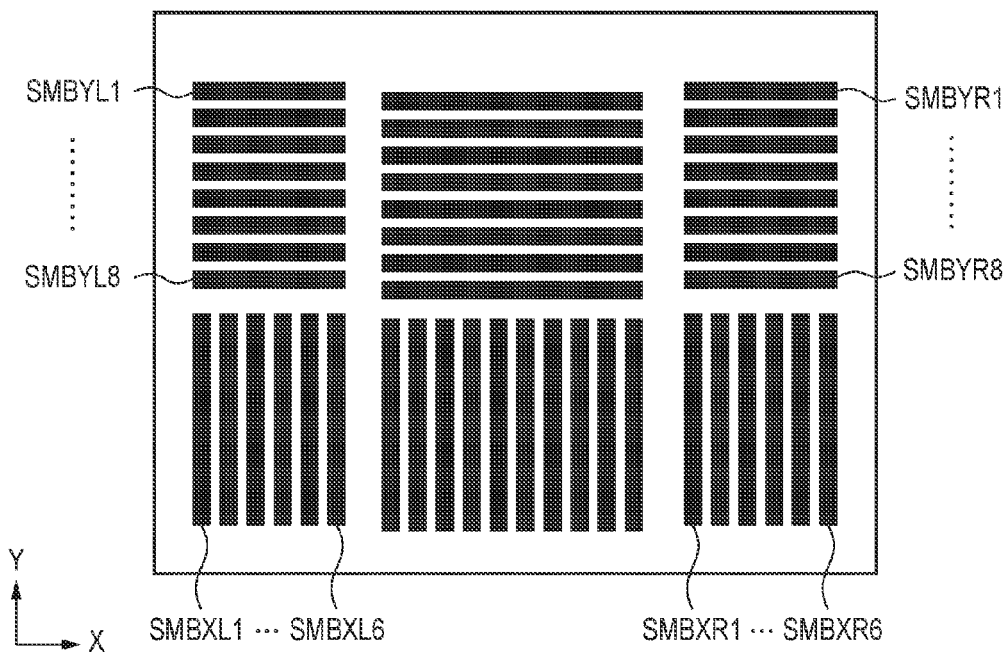

In the embodiment, as shown in FIG. 3A, the reticle mark RM includes a Y mark constituted by a plurality of Y bar marks RMBY1 to RMBY8, and an X mark constituted by a plurality of X bar marks RMBX1 to RMBX10. As shown in FIG. 3B, the reference mark SM includes a Y mark constituted by a plurality of Y bar marks SMBYL1 to SMBYL8 and a plurality of Y bar marks SMBYR1 to SMBYR8. Also, the reference mark SM includes an X mark constituted by a plurality of X bar marks SMBXL1 to SMBXL6 and a plurality of X bar marks SMBXR1 to SMBXR6. By constituting each of the X and Y marks by a plurality of bar marks in the reticle mark RM and the reference mark SM, the measurement precision can be increased by the averaging effect.

The reticle R is held by the reticle stage 11 so that the reticle mark RM and the reference mark SM overlap each other. The measurement apparatus 20 measures the relative position (positional relationship) between the reticle mark RM and reference mark SM, that is, the position of the reticle R on the reticle stage 11. The measurement apparatus 20 includes an alignment scope 30, an image processing unit 40, an overlay required precision unit 50, and a notification unit 60. The overlay required precision unit 50 includes a setting unit 51 and a storage unit 52. The overlay required precision unit 50 sets and stores a precision required for alignment between the reticle R and the substrate W, that is, a precision (overlay required precision) required for measurement of the position of an object by the measurement apparatus 20.

The alignment scope 30 includes a light source 31, an illumination system 32, an objective system 33, and an image sensor 34. The alignment scope 30 captures the reticle mark RM and the reference mark SM to acquire an image IMG as shown in FIG. 2. The image IMG is a two-dimensional image.

Figure 4:
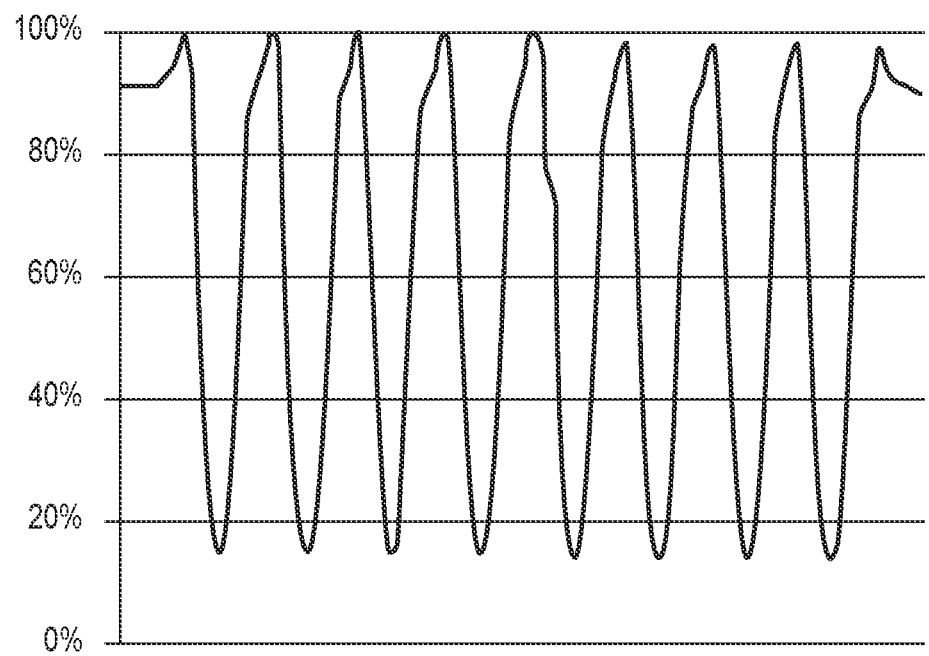
FIG. 4 is a graph showing an example of a one-dimensional integrated waveform generated by an image processing unit.

The image processing unit 40 includes an image storage unit 41, a region division unit 42, a position specifying unit 43, an error amount estimation unit 44, and a selection unit 45. The image processing unit 40 processes the image IMG captured by the alignment scope 30, and obtains the position of the reticle R on the reticle stage 11. The image IMG captured by the alignment scope 30 is stored in the image storage unit 41. As shown in FIG. 3A, the image processing unit 40 integrates in one direction a light amount in a measurement window WIN-Y set for the Y mark of the reticle mark RM, thereby generating a one-dimensional integrated waveform (detection signal) as shown in FIG. 4. In this manner, the alignment scope 30 and the image processing unit 40 function as a detection unit that detects the reticle mark RM and the reference mark SM to generate a detection signal. In FIG. 4, the position of the measurement window WIN-Y in the non-integration direction is employed for the abscissa, and a relative light amount when the maximum light amount in the measurement window WIN-Y is defined as 100% is employed for the ordinate. Referring to FIG. 4, the light amount decreases at positions where the Y bar marks RMBY1 to RMBY8 exist, and increases at positions where none of the Y bar marks RMBY1 to RMBY8 exists. In a normal state in which none of attachment of a particle (dust), a defect, and the like exists, light amounts at the respective Y bar marks are almost uniform.

The position specifying unit 43 processes the one-dimensional integrated waveform shown in FIG. 4, and specifies the respective positions of the reticle mark RM and reference mark SM on the image IMG. The position specifying unit 43 obtains the positions of the respective bar marks of the reticle mark RM and reference mark SM by, for example, barycenter calculation processing, and adds and averages the positions of the respective bar marks, thereby obtaining the center positions of the reticle mark RM and reference mark SM.

The position (measurement result) of the reticle R on the reticle stage 11 that is obtained by the image processing unit 40 is sent to the controller 14. The controller 14 obtains the misalignment amount of the reticle R with respect to the reticle stage 11. When projecting the pattern of the reticle R to the substrate W through the projection optical system 12, the controller 14 corrects the position of at least one of the reticle stage 11 and substrate stage 13 to perform alignment between the reticle R and the substrate W. In other words, the controller 14 controls the positions of the reticle stage 11 and substrate stage 13 based on the position of the reticle R that has been measured by the measurement apparatus 20.

In each embodiment, measurement processing (reticle alignment) of the measurement apparatus 20 in the exposure apparatus 1, that is, measurement processing of measuring the position of the reticle R on the reticle stage 11 will be explained in detail.

First Embodiment

Figure 5A:
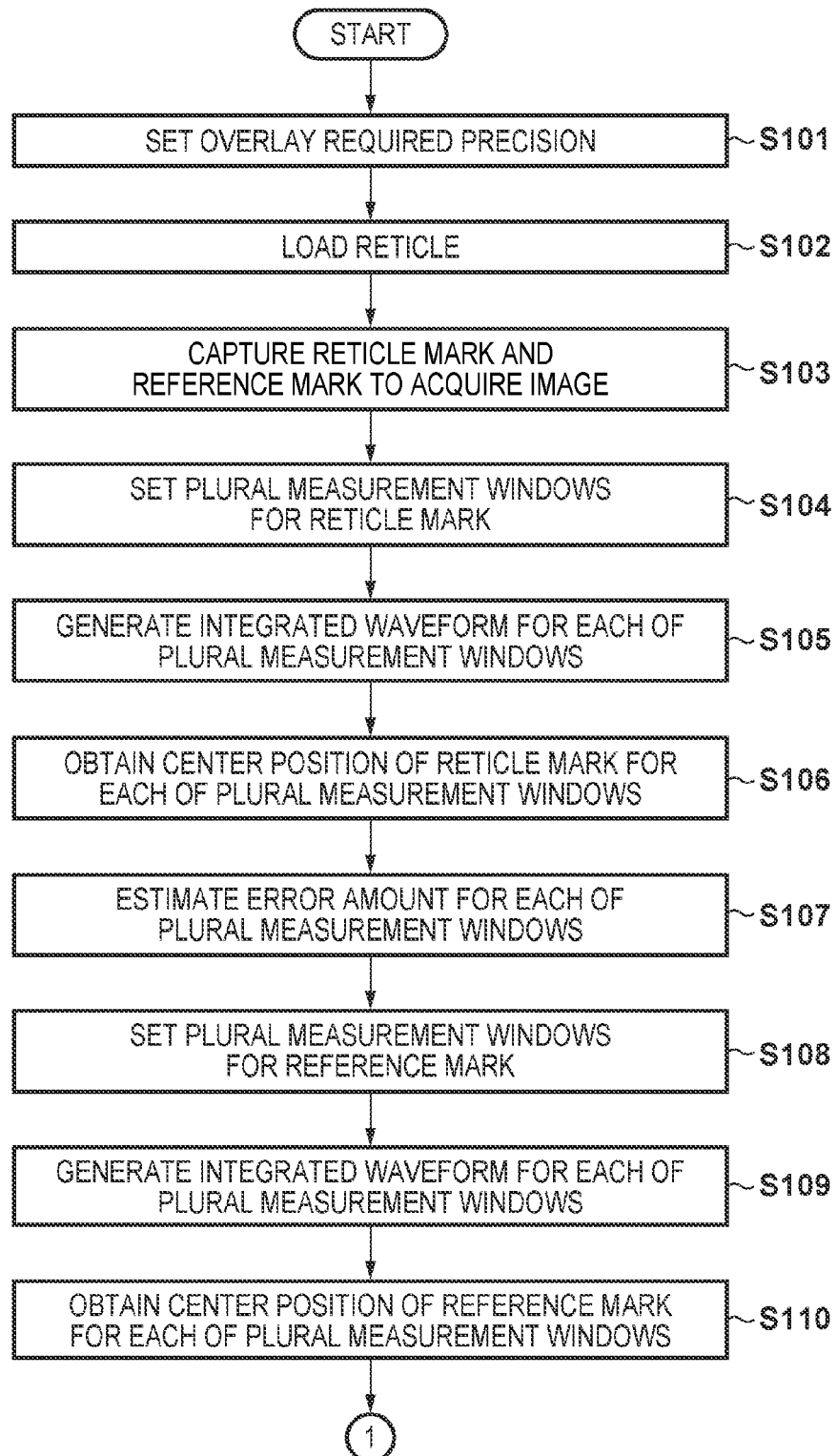
FIGS. 5A and 5B are flowcharts for explaining measurement processing according to the first embodiment.
Figure 5B:
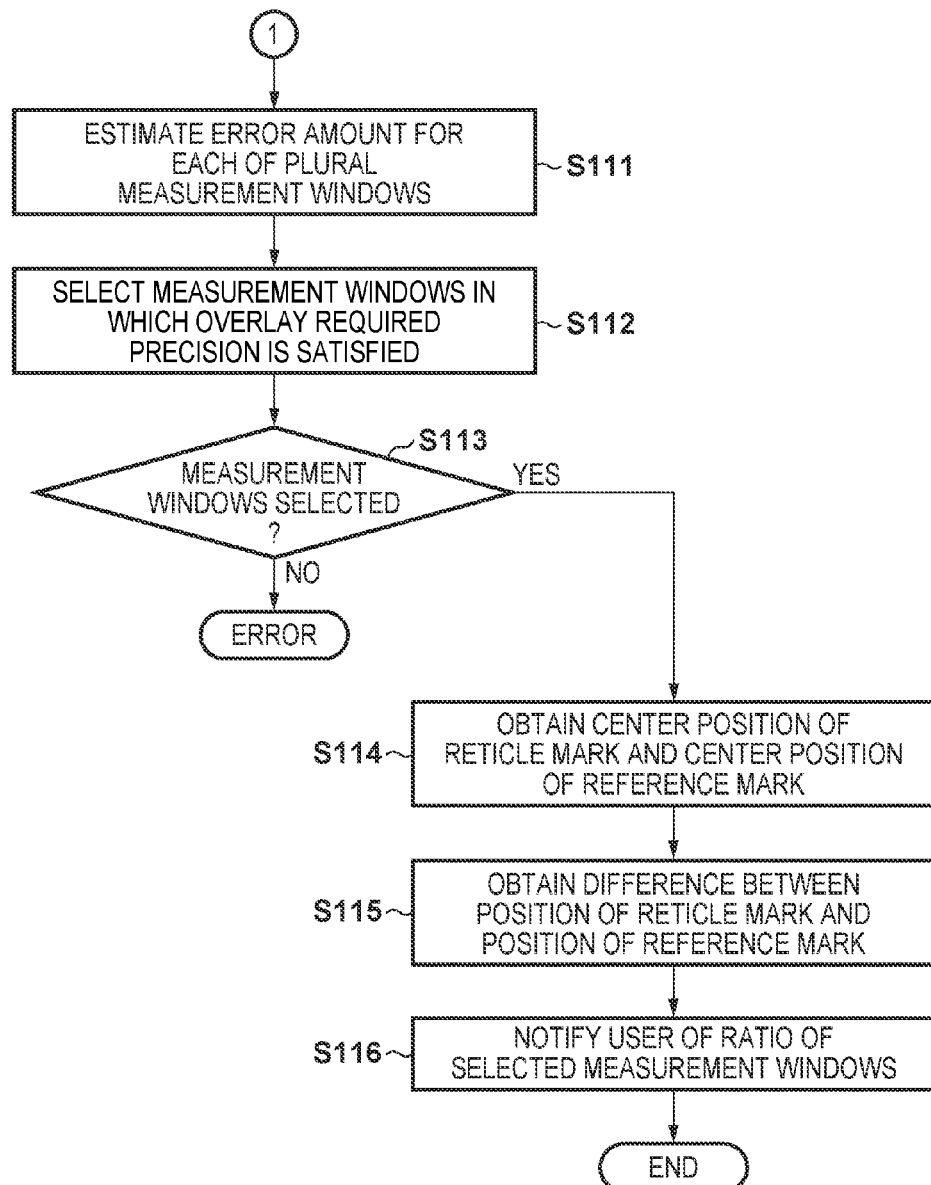

Measurement processing according to the first embodiment will be explained with reference to FIGS. 5A and 5B. In step S101, a setting unit 51 sets an overlay required precision in an image processing unit 40 as information about a tolerance regarding the measurement precision. For example, the setting unit 51 selects and sets one overlay required precision from overlay required precisions stored in a storage unit 52 in accordance with an input by a user. In other words, the setting unit 51 functions as an input unit that inputs an overlay required precision serving as information about a tolerance regarding the measurement precision. Note that the storage unit 52 stores in advance a plurality of overlay required precisions settable in the image processing unit 40.

In step S102, a reticle transfer system loads a reticle R onto a reticle stage 11, and holds the reticle R on the reticle stage 11 so that a reticle mark RM and a reference mark SM overlap each other.

In step S103, an alignment scope 30 captures the reticle mark RM and the reference mark SM to acquire an image (two-dimensional image). An image IMG captured by the alignment scope 30 is stored in an image storage unit 41.

Figure 6:
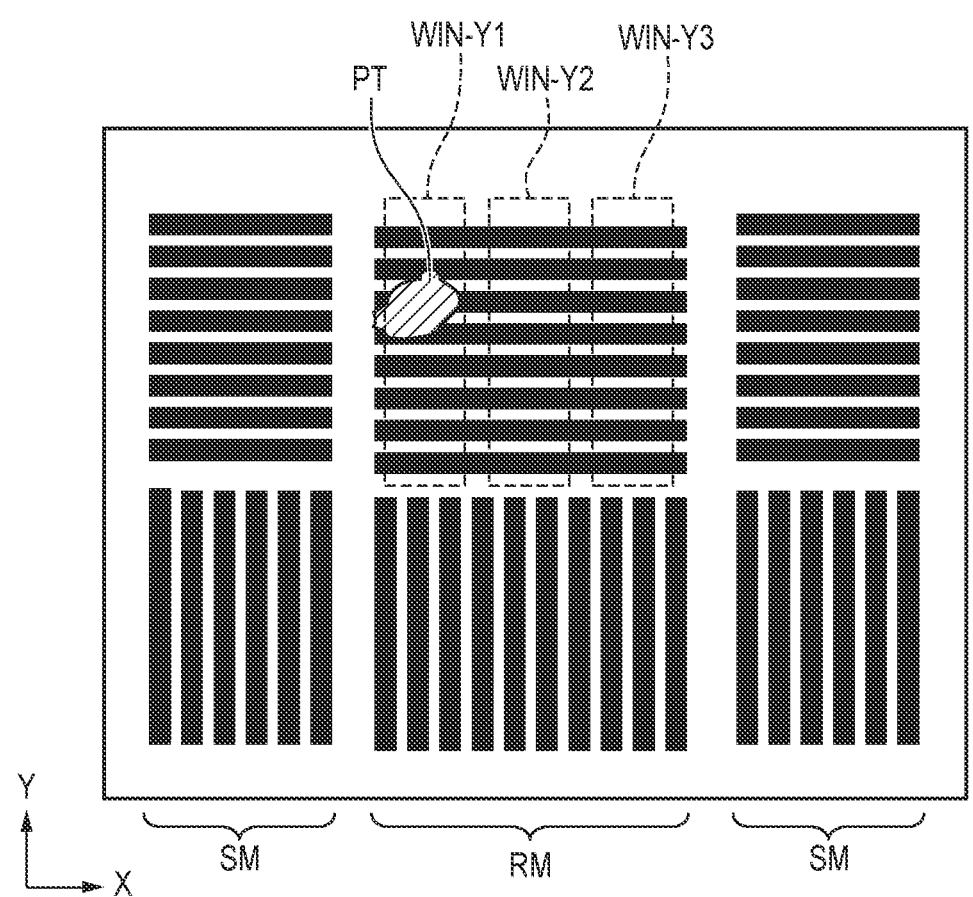
FIG. 6 is a view showing an example of a plurality of measurement windows set for the reticle mark.

In step S104, a region division unit 42 divides a mark region where the reticle mark RM is formed, into a plurality of regions, and sets a measurement window for each of the plurality of regions (that is, sets a plurality of measurement windows for the reticle mark RM). For example, the region division unit 42 divides the mark region into a plurality of regions in a direction perpendicular to the direction (first direction) in which a plurality of mark elements constituting a Y mark and an X mark are arrayed. In the embodiment, three measurement windows WIN-Y1, WIN-Y2, and WIN-Y3 are set for the Y mark of the reticle mark RM, as shown in FIG. 6. Note that the number of measurement windows set for the Y mark of the reticle mark RM is not limited to three. Similarly, a plurality of measurement windows are set for the X mark of the reticle mark RM.

In step S105, a position specifying unit 43 integrates a light amount in each of the plurality of measurement windows set in step S104 in the image acquired in step S103 in the non-measurement direction, thereby generating a one-dimensional integrated waveform as shown in FIG. 4 for each of the plurality of measurement windows.

In step S106, the position specifying unit 43 obtains the center position of the reticle mark RM from the integrated waveform generated in step S105 for each of the plurality of measurement windows by using, for example, barycenter calculation processing or template matching processing. In other words, for each of the plurality of measurement windows, the position specifying unit 43 obtains the center position of part of the reticle mark RM formed in each measurement window based on a portion of the integrated waveform generated in step S105 that corresponds to each measurement window.

In step S107, for each of the plurality of measurement windows, an error amount estimation unit 44 estimates an error amount that may be generated when obtaining the center position of the reticle mark RM in step S106. In other words, the error amount estimation unit 44 evaluates a position measurement error in regard to each of a plurality of portions (portions corresponding to the respective measurement windows) of the integrated waveform (detection signal) generated in step S105. More specifically, the error amount estimation unit 44 estimates an error amount by using a value regarding a feature amount such as the degree of bilateral symmetry of the integrated waveform, the peak-and-valley shape, or the contrast, as disclosed in, for example, Japanese Patent No. 5132277. The error amount estimation unit 44 may estimate an error amount by using another index such as the S/N ratio of the integrated waveform.

In step S108, as in step S104, the region division unit 42 divides a mark region where the reference mark SM is formed, into a plurality of regions, and sets a measurement window for each of the plurality of regions (that is, sets a plurality of measurement windows for the reference mark SM).

In step S109, as in step S105, the position specifying unit 43 integrates a light amount in each of the plurality of measurement windows set in step S108 in the image acquired in step S103 in the non-measurement direction, thereby generating a one-dimensional integrated waveform for each of the plurality of measurement windows.

In step S110, as in step S106, the position specifying unit 43 obtains the center position of the reference mark SM from the integrated waveform generated in step S109 for each of the plurality of measurement windows by using, for example, barycenter calculation processing. In other words, for each of the plurality of measurement windows, the position specifying unit 43 obtains the center position of part of the reference mark SM formed in each measurement window based on a portion of the integrated waveform generated in step S109 that corresponds to each measurement window.

In step S111, as in step S107, for each of the plurality of measurement windows, the error amount estimation unit 44 estimates an error amount that may be generated when obtaining the center position of the reference mark SM in step S110. In other words, the error amount estimation unit 44 evaluates a position measurement error in regard to each of a plurality of portions (portions corresponding to the respective measurement windows) of the integrated waveform (detection signal) generated in step S109.

In step S112, a selection unit 45 selects, based on the error amounts estimated in steps S107 and S111, measurement windows in which the overlay required precision is satisfied. More specifically, the selection unit 45 compares the overlay required precision set in step S101 with the error amounts respectively estimated in steps S107 and S111. Then, the selection unit 45 selects measurement windows in which the overlay required precision is satisfied, out of the plurality of measurement windows set in steps S104 and S108 (that is, portions at which the position measurement error satisfies the tolerance, out of a plurality of portions of the detection signal).

In step S113, the position specifying unit 43 determines whether measurement windows have been selected in step S112. If no measurement window has been selected in step S112, that is, if error amounts in all the measurement windows do not satisfy the overlay required precision, reticle alignment is determined as an error and the process is ended. If measurement windows have been selected in step S112, that is, if there are measurement windows in which the overlay required precision is satisfied, the process shifts to step S114.

In step S114, the position specifying unit 43 obtains the center position of the reticle mark RM and the center position of the reference mark SM. More specifically, the position specifying unit 43 averages center positions of the reticle mark RM that are obtained from the measurement windows selected in step S112, obtaining the final center position of the reticle mark RM. Similarly, the position specifying unit 43 averages center positions of the reference mark SM that are obtained from the measurement windows selected in step S112, obtaining the final center position of the reference mark SM.

In step S115, the position specifying unit 43 obtains the difference between the position of the reticle mark RM and the position of the reference mark SM based on the center position of the reticle mark RM and the center position of the reference mark SM that have been obtained in step S114. The difference between the position of the reticle mark RM and the position of the reference mark SM is the position (shift amount) of the reticle R on the reticle stage 11. In this manner, according to the embodiment, the position of the reticle R on the reticle stage 11 is obtained based on the position of part of a mark at which the overlay required precision set in step S101 is satisfied, out of the positions of parts of the mark obtained in steps S106 and S110.

In step S116, a notification unit 60 notifies the user of the ratio of the measurement windows selected in step S112 (that is, the ratio, to the detection signal, of the portions at which the position measurement error satisfies the tolerance), out of the plurality of measurement windows respectively set in steps S104 and S108. For example, a case will be examined, in which an error amount in the measurement window WIN-Y1, out of the three measurement windows WIN-Y1, WIN-Y2, and WIN-Y3, does not satisfy the overlay required precision owing to attachment of a particle PT, as shown in FIG. 6. In this case, the two measurement windows WIN-Y2 and WIN-Y3 excluding the measurement window WIN-Y1 are selected in step S112, so the notification unit 60 notifies the user of ⅔=66.67% as the measurement window selection ratio. Alternatively, the notification unit 60 may notify the user of ⅓=33.33% as the ratio (measurement window removal amount) of the measurement window not selected in step S112. In this way, the user is notified of information about attachment of a particle, a defect, and the like on the reticle mark RM and the reference mark SM. Planned cleaning can therefore be performed on the reticle mark RM and the reference mark SM in a subsequent step.

As described above, according to the first embodiment, a portion at which the position measurement error satisfies the tolerance is selected from a plurality of portions of a detection signal, and the position of the reticle R is obtained based on this portion. In other words, the position of the reticle R is obtained based on a portion of the detection signal that is limited based on information about the tolerance regarding the measurement precision. In the first embodiment, even when attachment of a particle, a defect, or the like exists on the reticle mark RM or the reference mark SM, if the overlay required precision is satisfied, the position (shift amount) of the reticle R can be measured without determining reticle alignment as an error. As a result, the frequency at which an exposure apparatus 1 is stopped can be decreased to increase the throughput.

Second Embodiment

Figure 7A:
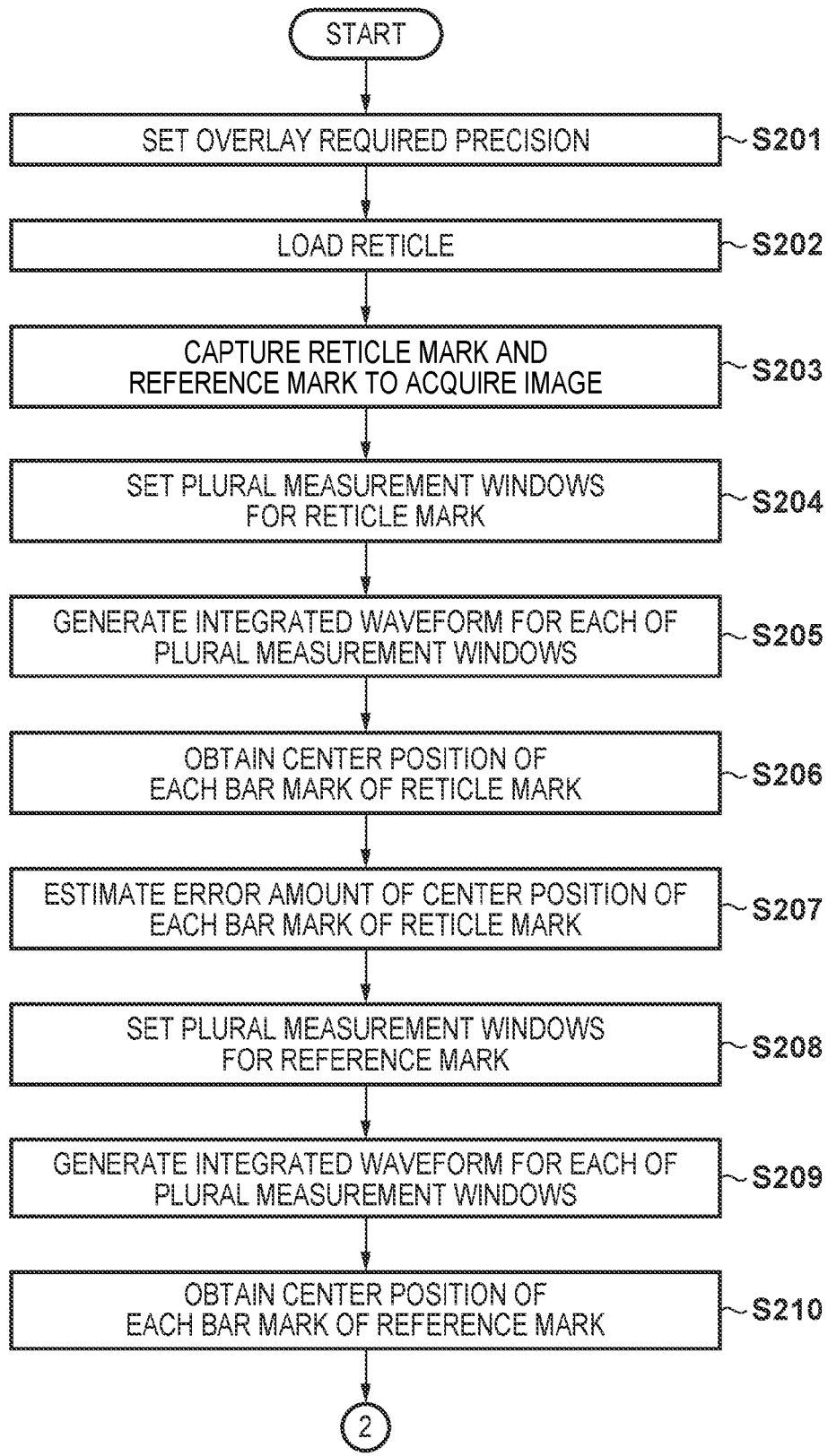
FIGS. 7A and 7B are flowcharts for explaining measurement processing according to the second embodiment.
Figure 7B:
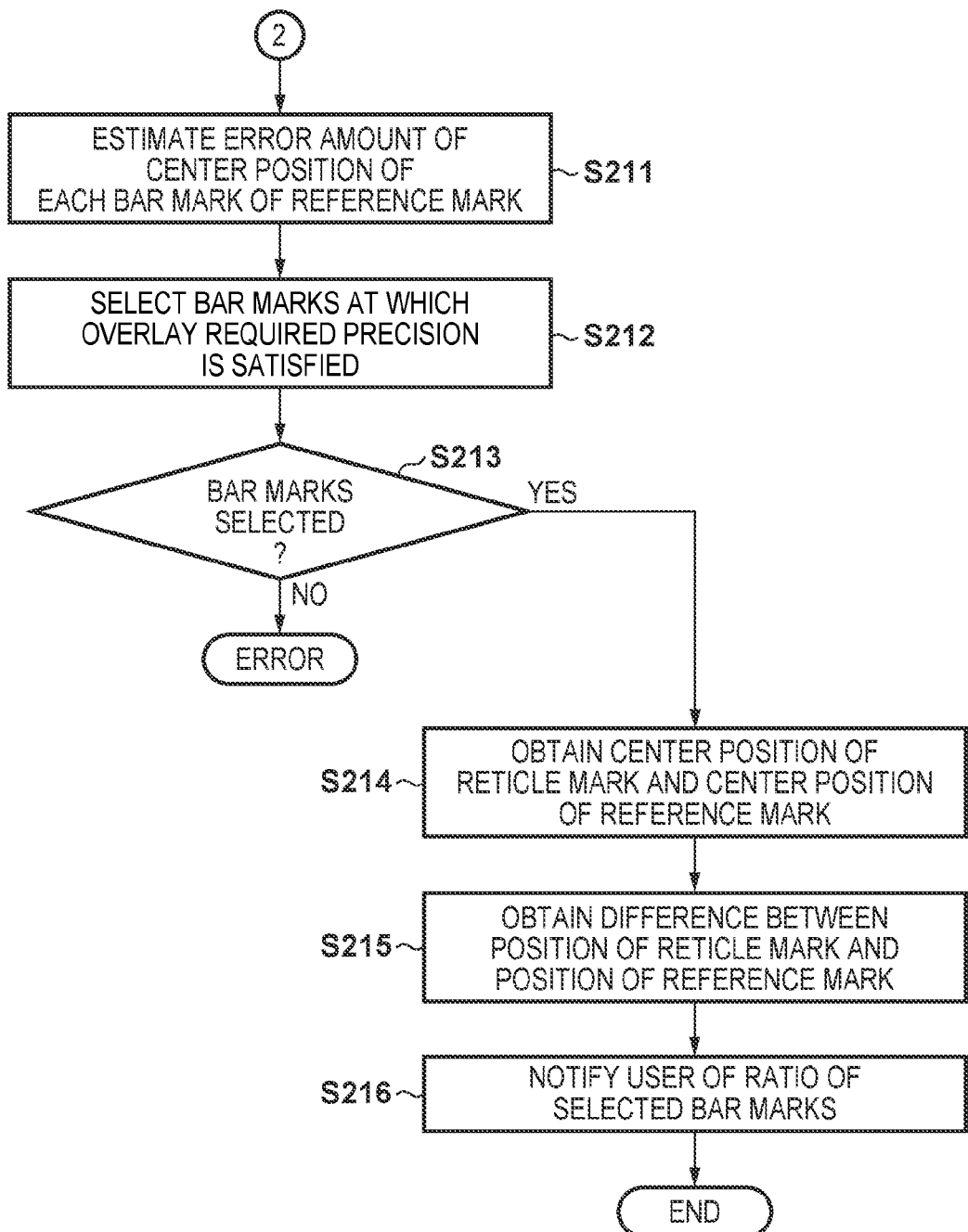

Measurement processing according to the second embodiment will be explained with reference to FIGS. 7A and 7B. Steps S201 to S205 are the same as steps S101 to S105 described in the first embodiment, respectively, and a detailed description thereof will not be repeated.

In step S206, a position specifying unit 43 obtains the center positions of bar marks constituting each of the Y and X marks of a reticle mark RM from an integrated waveform generated in step S205 by using, for example, barycenter calculation processing or template matching processing. In the second embodiment, the position specifying unit 43 obtains the center positions of respective Y bar marks RMBY1 to RMBY8 constituting the Y mark of the reticle mark RM, and the center positions of respective X bar marks RMBX1 to RMBX10 constituting the X mark of the reticle mark RM.

In step S207, for each of the bar marks constituting the Y and X marks of the reticle mark RM, an error amount estimation unit 44 estimates an error amount that may be generated when obtaining the center position of each bar mark in step S206. In other words, the error amount estimation unit 44 evaluates a position measurement error in regard to each of a plurality of portions (portions corresponding to the respective bar marks) of the integrated waveform (detection signal) generated in step S205.

Steps S208 and S209 are the same as steps S108 and S109 described in the first embodiment, respectively, and a detailed description thereof will not be repeated.

In step S210, the position specifying unit 43 obtains the center position of each bar mark constituting each of the Y and X marks of the reference mark SM from the integrated waveform generated in step S209 by using, for example, barycenter calculation processing or template matching processing. In the embodiment, the position specifying unit 43 obtains the center position of each of the Y bar marks SMBYL1 to SMBYL8 and Y bar marks SMBYR1 to SMBYR8 constituting the Y mark of the reference mark SM. Similarly, the position specifying unit 43 obtains the center position of each of the X bar marks SMBXL1 to SMBXL6 and X bar marks SMBXR1 to SMBXR6 constituting the X mark of the reference mark SM.

In step S211, for each of the bar marks constituting the Y and X marks of the reference mark SM, the error amount estimation unit 44 estimates an error amount that may be generated when obtaining the center position of each bar mark in step S210. In other words, the error amount estimation unit 44 evaluates a position measurement error in regard to each of a plurality of portions (portions corresponding to the respective bar marks) of the integrated waveform (detection signal) generated in step S209.

In step S212, a selection unit 45 selects, based on the error amounts estimated in steps S207 and S211, bar marks at which the overlay required precision is satisfied. More specifically, the selection unit 45 compares the overlay required precision set in step S201 with the error amounts respectively estimated in steps S207 and S211. Then, the selection unit 45 selects bar marks at which the overlay required precision is satisfied, out of the plurality of bar marks constituting the reticle mark RM and the reference mark SM (that is, portions of the detection signal that correspond to some bar marks and at which the position measurement error satisfies the tolerance).

In step S213, the position specifying unit 43 determines whether bar marks have been selected in step S212. If no bar mark has been selected in step S212, that is, if the error amounts of all the bar marks do not satisfy the overlay required precision, reticle alignment is determined as an error and the process is ended. If bar marks have been selected in step S212, that is, if there are bar marks at which the overlay required precision is satisfied, the process shifts to step S214.

In step S214, the position specifying unit 43 obtains the center position of the reticle mark RM and the center position of the reference mark SM. More specifically, the position specifying unit 43 averages the center positions of the bar marks that have been selected in step S212 and constitute the reticle mark RM, obtaining the final center position of the reticle mark RM. Similarly, the position specifying unit 43 averages the center positions of the bar marks that have been selected in step S212 and constitute the reference mark SM, obtaining the final center position of the reference mark SM.

In step S215, the position specifying unit 43 obtains the difference between the position of the reticle mark RM and the position of the reference mark SM based on the center position of the reticle mark RM and the center position of the reference mark SM that have been obtained in step S214. The difference between the position of the reticle mark RM and the position of the reference mark SM is the position (shift amount) of the reticle R on a reticle stage 11. In this way, according to the embodiment, the position of the reticle R on the reticle stage 11 is obtained based on the positions of bar marks at which the overlay required precision set in step S201 is satisfied, out of the plurality of bar marks constituting the reticle mark RM and the reference mark SM.

In step S216, a notification unit 60 notifies the user of the ratio of the bar marks selected in step S212, out of the plurality of bar marks constituting the reticle mark RM and the reference mark SM. In other words, the notification unit 60 notifies the user of the ratio of some bar marks to the plurality of bar marks, that is, the ratio of bar marks at which the position measurement error satisfies the tolerance. Alternatively, the notification unit 60 may notify the user of the ratio (bar mark removal amount) of bar marks not selected in step S212.

For example, a particle PT is sometimes attached to the entire region of the reticle mark RM in the non-measurement direction, as shown in FIG. 8. Even in this case, the position (shift amount) of the reticle R can be measured from the positions of bar marks at which the overlay required precision is satisfied, without determining reticle alignment as an error. Hence, the frequency at which an exposure apparatus 1 is stopped can be decreased to increase the throughput.

Third Embodiment

Figure 9B:
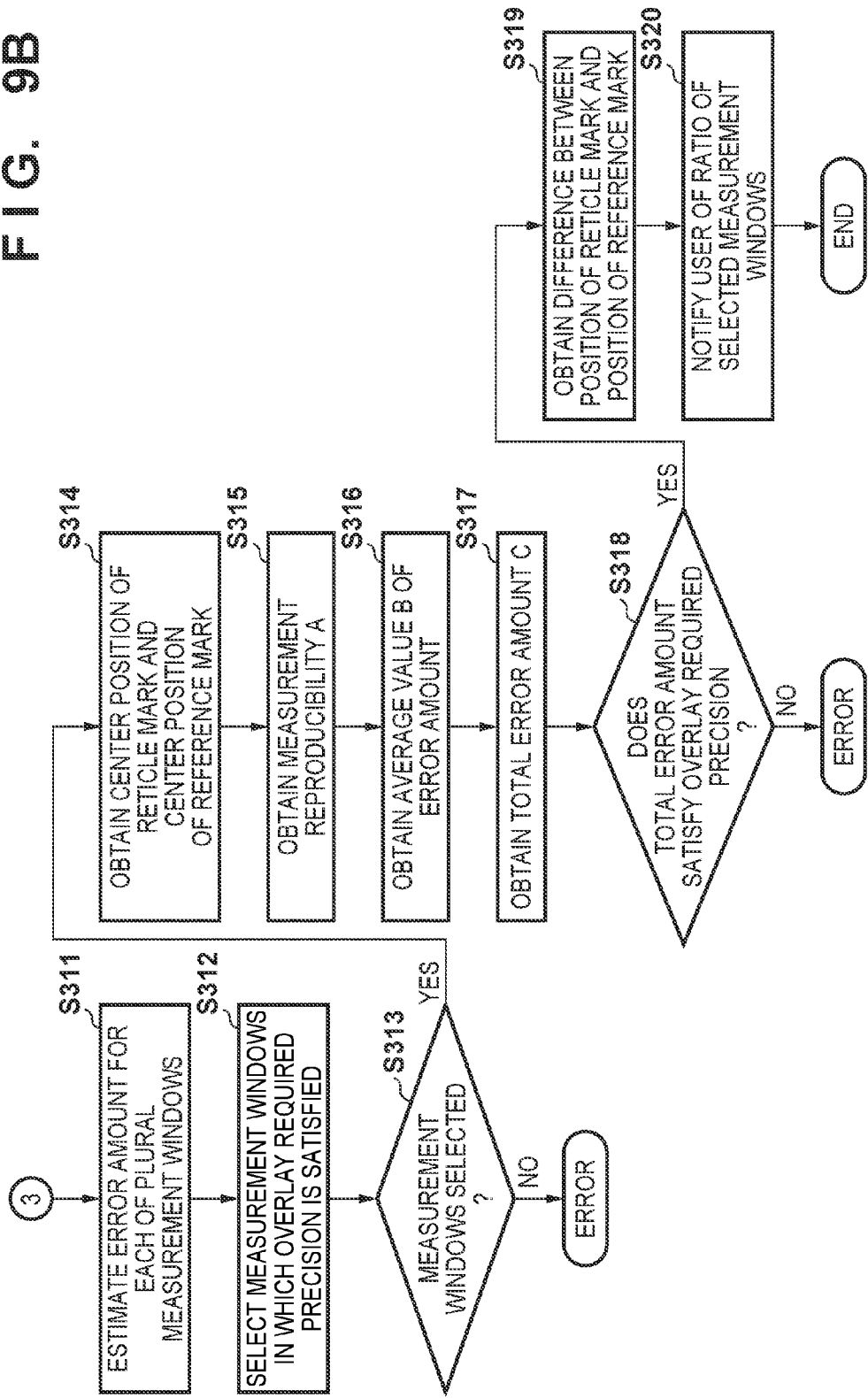

Measurement processing according to the third embodiment will be explained with reference to FIGS. 9A and 9B. In the third embodiment, the position measurement precision is evaluated for each of a plurality of portions in a detection signal, portions at which the position measurement precision satisfies a tolerance are selected from the plurality of portions in the detection signal, and the position of a reticle R is obtained based on these portions. Steps S301 to S314 are the same as steps S101 to S114 described in the first embodiment, respectively, and a detailed description thereof will not be repeated.

In step S315, an error amount estimation unit 44 obtains (a change of) measurement reproducibility A arising from a decrease in measurement windows, based on the ratio of the measurement window not selected in step S312, that is, the measurement window in which the overlay required precision is not satisfied. In the embodiment, the measurement precision (measurement reproducibility) is increased by the averaging effect by constituting each of a reticle mark RM and a reference mark SM by a plurality of bar marks, as described above. However, when a measurement window in which the overlay required precision is not satisfied is not selected, the averaging effect is reduced by that amount. For example, when the measurement reproducibility in a case in which all measurement windows are selected is $3\sigma=5$ nm, the measurement reproducibility A in a case in which half the measurement windows are selected is $A=5/\sqrt{(50/100)}$ =7.1 nm. Note that the measurement reproducibility in a case in which all measurement windows are selected needs to be stored in advance in an image processing unit 40.

In step S316, the error amount estimation unit 44 obtains an average value B of the error amounts of the reticle mark RM and reference mark SM in the measurement windows selected in step S312. The average value B is the average value of error amounts that may be generated when obtaining the center positions of the reticle mark RM and reference mark SM.

In step S317, the error amount estimation unit 44 obtains a total error amount C in reticle alignment based on the measurement reproducibility A obtained in step S315 and the average value B obtained in step S316. For example, the error amount estimation unit 44 obtains the total error amount C from the root-sum-square of the measurement reproducibility A and average value B, that is, $C=\sqrt{(A^2+B^2)}$.

In step S318, the error amount estimation unit 44 determines whether the total error amount C obtained in step S317 satisfies the overlay required precision set in step S301. If the total error amount C does not satisfy the overlay required precision, reticle alignment is determined as an error and the process is ended. If the total error amount C satisfies the overlay required precision, the process shifts to step S319.

Steps S319 and S320 are the same as steps S115 and S116 described in the first embodiment, respectively, and a detailed description thereof will not be repeated. Note that the notification, in step S320, of the ratio of measurement windows selected in step S312 can be rewritten into the notification of the ratio, to the detection signal, of portions at which the position measurement precision satisfies the tolerance.

In the third embodiment, when the statistical value (total error amount C) of the error amounts estimated in steps S307 and S311 satisfies the overlay required precision, the position (shift amount) of the reticle R is measured without determining reticle alignment as an error. Even when the measurement reproducibility is poor and the ratio of measurement windows greatly contributes to the precision (measurement precision) of reticle alignment, reticle alignment can be performed in accordance with the overlay required precision. When the measurement reproducibility is satisfactorily high, a result obtained in the third embodiment substantially coincides with a result obtained in the first embodiment, and the first embodiment is superior to the third embodiment in terms of the processing time. The third embodiment is also applicable to the second embodiment.

Fourth Embodiment

Figure 10:
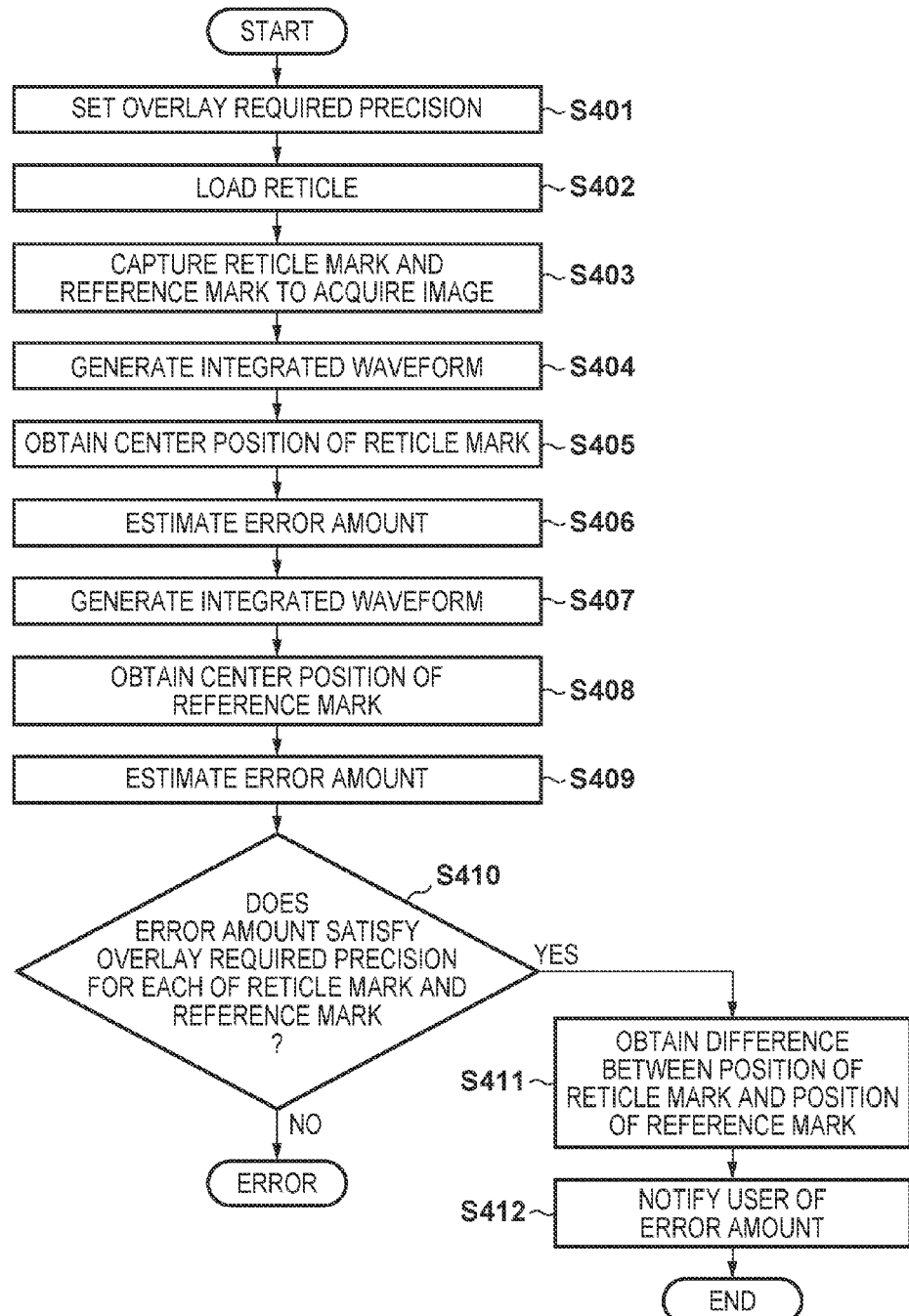
FIG. 10 is a flowchart for explaining measurement processing according to the fourth embodiment.

Measurement processing according to the fourth embodiment will be explained with reference to FIG. 10. Steps S401 to S403 are the same as steps S101 to S103 described in the first embodiment, respectively, and a detailed description thereof will not be repeated.

In step S404, a position specifying unit 43 integrates a light amount in an image acquired in step S403 in the non-measurement direction for a reticle mark RM, thereby generating a one-dimensional integrated waveform as shown in FIG. 4.

In step S405, the position specifying unit 43 obtains the center position of the reticle mark RM based on the integrated waveform generated in step S404 by using, for example, barycenter calculation processing or template matching processing.

In step S406, an error amount estimation unit 44 estimates an error amount that may be generated when obtaining the center position of the reticle mark RM in step S405. In other words, the error amount estimation unit 44 evaluates a position measurement error in regard to the integrated waveform (detection signal) generated in step S404.

In step S407, as in step S404, the position specifying unit 43 integrates a light amount in the image acquired in step S403 in the non-measurement direction for a reference mark SM, thereby generating a one-dimensional integrated waveform.

In step S408, as in step S405, the position specifying unit 43 obtains the center position of the reference mark SM based on the integrated waveform generated in step S407 by using, for example, barycenter calculation processing or template matching processing.

In step S409, as in step S406, the error amount estimation unit 44 estimates an error amount that may be generated when obtaining the center position of the reticle mark RM in step S408. In other words, the error amount estimation unit 44 evaluates a position measurement error in regard to the integrated waveform (detection signal) generated in step S407.

In step S410, for each of the reticle mark RM and reference mark SM, the error amount estimation unit 44 determines whether the error amount estimated in each of steps S406 and S409 satisfies the overlay required precision set in step S401. In the embodiment, the error amount estimation unit 44 determines whether an error amount that may be generated when obtaining the center position of each of the reticle mark RM and reference mark SM satisfies the tolerance (overlay required precision) regarding the measurement precision. If the error amount estimated in each of steps S406 and S409 does not satisfy the overlay required precision, reticle alignment is determined as an error and the process is ended. If the error amount estimated in each of steps S406 and S409 satisfies the overlay required precision, the process shifts to step S411.

In step S411, the position specifying unit 43 obtains the difference between the position of the reticle mark RM and the position of the reference mark SM based on the center position of the reticle mark RM obtained in step S405 and the center position of the reference mark SM obtained in step S408. The difference between the position of the reticle mark RM and the position of the reference mark SM is the position (shift amount) of the reticle R on a reticle stage 11, as described above. In this fashion, according to the embodiment, if the error amount estimated in each of steps S406 and S409 satisfies the overlay required precision set in step S401, the position of the reticle R on the reticle stage 11 is obtained.

In step S412, a notification unit 60 notifies the user of the error amount estimated in each of steps S406 and S409 (that is, the error amount for each of the reticle mark RM and reference mark SM).

As described above, according to the fourth embodiment, a one-dimensional integrated waveform is generated to obtain the center positions of the reticle mark RM and reference mark SM without dividing, into a plurality of regions, the mark region where the reticle mark RM and the reference mark SM are formed (that is, without setting a plurality of measurement windows). More specifically, when a detection signal satisfies the tolerance (overlay required precision) regarding the measurement precision, the position of the reticle R is obtained based on the detection signal. In a process in which the frequency of attachment of a particle to the reticle mark RM and the reference mark SM or the like is low, the position (shift amount) of the reticle R can be measured without prolonging the processing time (time necessary for reticle alignment). Therefore, the frequency at which an exposure apparatus 1 is stopped can be decreased to increase the throughput.

The exposure apparatus 1 is suitable for manufacturing an article, for example, a microdevice such as a semiconductor device or an element having a microstructure. A method of manufacturing an article includes a step of forming a latent image pattern on a photoresist applied to a substrate by using the exposure apparatus 1 (a step of performing patterning on a substrate), and a step of processing the substrate on which the latent image pattern has been formed in the preceding step (a step of developing the substrate having undergone patterning). This manufacturing method can further include other known steps (oxidation, deposition, vapor deposition, doping, planarization, etching, resist removal, dicing, bonding, packaging, and the like). The method of manufacturing an article according to the embodiment is superior to a conventional method in at least one of the performance, quality, productivity, and production cost of the article.

Although the present invention has been explained by exemplifying the position of a reticle on the reticle stage as the position of an object, the position of a substrate on the substrate stage may be the position of an object to be measured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-003608 filed on Jan. 9, 2015, which is hereby incorporated by reference herein in its entirety.

What is claimed is:

1. A measurement apparatus that measures a position of an object, the apparatus comprising:
a detector configured to obtain an image of a mark formed on the object; and
a processor configured to generate detection data from the obtained image and obtain the position of the object based on the detection data,
wherein the processor is configured to generate a plurality of detection data from portions of the image into which a region of the mark is divided, evaluate a position measurement error with respect to each of the plurality of detection data, select a portion, which falls within a tolerance of a precision required for measurement of the position of the object by the measurement apparatus based on the evaluated position measurement error, from the plurality of detection data, and obtain the position of the object based on the selected portion from the plurality of detection data.

2. The apparatus according to claim 1, wherein the processor is configured to evaluate the position measurement error by using degree of bilateral symmetry of each of the plurality of detection data or contrast of each of the plurality of detection data.

3. The apparatus according to claim 1,
wherein the processor is configured to obtain a total amount of error based on measurement reproducibility with respect to the selected portion and an average value of amounts of position measurement errors with respect to the selected portion and determine whether the total amount of error satisfies the tolerance,
wherein, in a case where the total amount does not satisfy the tolerance, the processor does not obtain the position of the object based on the selected portion, and
wherein, in a case where the total amount satisfies the tolerance, the processor obtains the position of the object based on the selected portion.

4. The apparatus according to claim 3, wherein the mark includes a plurality of mark elements arrayed in a first direction, and
the processor is configured to select, as the portion, at least one of the plurality of mark elements.

5. The apparatus according to claim 4, further comprising a notification device configured to notify a user of a ratio of the portion to the plurality of mark elements.

6. The apparatus according to claim 1, wherein the mark includes a plurality of mark elements arrayed in a first direction, and
the processor is configured to generate the plurality of detection data from the portions of the image into which the region of the mark is divided in a direction perpendicular to the first direction.

7. The apparatus according to claim 1, further comprising a notification device configured to notify a user of a ratio of the selected portion of the detection data to the plurality of detection data.

8. The apparatus according to claim 1, further comprising an input device configured to input information about the tolerance.

9. The apparatus according to claim 1,
wherein a plurality of measurement windows are set for a plurality of regions into which the region of the mark is divided, and
wherein the processor is configured to select, as the portion, corresponding to at least one of the plurality of measurement windows.

10. A lithography apparatus that performs patterning with respect to an object, the apparatus comprising:
a holder configured to hold the object and be movable; and
a measurement apparatus configured to measure a position of the object,
the measurement apparatus including:
a detector configured to obtain an image of a mark formed on the object; and
a processor configured to generate detection data from the obtained image and obtain the position of the object based on the detection data,
wherein the processor is configured to generate a plurality of detection data from portions of the image into which a region of the mark is divided, evaluate a position measurement error with respect to each of the plurality of detection data, select a portion, which falls within a tolerance of a precision required for measurement of the position of the object by the measurement apparatus based on the evaluated position measurement error, from the plurality of detection data and obtain the position of the object based on the selected portion from the plurality of detection data.

11. The apparatus according to claim 10, wherein the object includes an original for the patterning or a substrate to undergo the patterning or both thereof.

12. A method of manufacturing an article, the method comprising:
performing patterning on a substrate using a lithography apparatus; and
processing the substrate, on which the patterning has been performed, to manufacture the article,
wherein the lithography apparatus includes:
a holder configured to hold the substrate and be movable; and
a measurement apparatus configured to measure a position of the substrate,
the measurement apparatus including:
a detector configured to obtain an image of a mark formed on the substrate; and
a processor configured to generate detection data from the obtained image and obtain the position of the substrate based on the detection data,
wherein the processor is configured to generate a plurality of detection data from portions of the image into which a region of the mark is divided, evaluate a position measurement error with respect to each of the plurality of detection data, select a portion, which falls within a tolerance of a precision required for measurement of the position of the substrate by the measurement apparatus based on the evaluated position measurement error, from the plurality of detection data and obtain the position of the substrate based on the selected portion from the plurality of detection data.

13. A measurement apparatus that measures a position of an object, the apparatus comprising:
a detector configured to obtain an image of a mark formed on the object; and
a processor configured to generate detection data from the obtained image and obtain the position of the object based on the detection data,
wherein the processor is configured to obtain the position of the object based on a portion of the detection data that is limited based on information about a tolerance regarding a measurement precision for the object,
wherein the processor is configured to evaluate a position measurement error with respect to each of a plurality of portions of the detection data, select, based on the information, a portion of the plurality portions at which the position measurement error satisfies the tolerance, and obtain the position of the object based on the portion,
wherein the mark includes a plurality of mark elements arrayed in a first direction, and
wherein the plurality of portions corresponds to a plurality of regions obtained by dividing the mark in a direction perpendicular to the first direction.

14. A measurement apparatus that measures a position of an object, the apparatus comprising:
a detector configured to obtain an image of a mark formed on the object; and
a processor configured to generate detection data from the obtained image and obtain the position of the object based on the detection data,
wherein the processor is configured to obtain the position of the object based on a portion of the detection data that is limited based on information about a tolerance regarding a measurement precision for the object, and
wherein a notification device is configured to notify the user of a ratio of the portion to the detection data.

15. A measurement apparatus that measures a position of an object, the apparatus comprising:
a detector configured to obtain an image of a mark formed on the object; and
a processor configured to generate detection data from the obtained image and obtain the position of the object based on the detection data,
wherein the processor is configured to obtain the position of the object based on a portion of the detection data that is limited based on information about a tolerance regarding a measurement precision for the object,
wherein the processor is configured to evaluate a position measurement precision with respect to each of a plurality of portions of the detection data, select, based on the information, a portion of the plurality of portions at which the position measurement precision satisfies the tolerance, and obtain the position of the object based on the portion,
wherein the mark includes a plurality of mark elements arrayed in a first direction, and
wherein the processor is configured to obtain the position of the object based on the portion corresponding to partial mark elements of the plurality of mark elements at which the position measurement precision satisfies the tolerance.

16. The apparatus according to claim 15, further comprising a notification device configured to notify a user of a ratio of the partial mark elements to the plurality of mark elements.

* * * * *